United States Patent
Warner et al.

(10) Patent No.: US 12,538,716 B2
(45) Date of Patent: Jan. 27, 2026

(54) JOSEPHSON JUNCTION DEVICE WITH ORTHOGONAL ELECTRODES

(71) Applicants: Patrick R. Warner, Hampstead, MD (US); Justin C. Hackley, Catonsville, MD (US); Shawn A. Keebaugh, Annapolis, MD (US); Aurelius L. Graninger, Sykesville, MD (US)

(72) Inventors: Patrick R. Warner, Hampstead, MD (US); Justin C. Hackley, Catonsville, MD (US); Shawn A. Keebaugh, Annapolis, MD (US); Aurelius L. Graninger, Sykesville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 451 days.

(21) Appl. No.: 17/967,584

(22) Filed: Oct. 17, 2022

(65) Prior Publication Data

US 2024/0130250 A1    Apr. 18, 2024

(51) Int. Cl.
*H10N 60/80*     (2023.01)
*H10N 60/01*     (2023.01)
(Continued)

(52) U.S. Cl.
CPC ....... *H10N 60/805* (2023.02); *H10N 60/0912* (2023.02); *H10N 60/12* (2023.02); *H10N 60/85* (2023.02)

(58) Field of Classification Search
CPC .............. H10N 60/805; H10N 60/85; H10N 60/12–126; H10N 60/0912–0941;
(Continued)

(56) References Cited

U.S. PATENT DOCUMENTS

| | | | |
|---|---|---|---|
| 2005/0123674 A1* | 6/2005 | Stasiak | B82Y 40/00 505/471 |
| 2016/0211438 A1* | 7/2016 | Chang | H10N 60/0912 |
| 2022/0037578 A1* | 2/2022 | Rodbell | G03F 7/038 |

FOREIGN PATENT DOCUMENTS

JP        H0794793 A  *  4/1995  ............. H01L 39/24

OTHER PUBLICATIONS

Wu, et al.: "Overlap junctions for high coherence superconducting qubits"; Appl. Phys. Lett. 111, 032602 (2017); https://doi.org/10.1063/1.4993937 Submitted: May 16, 2017 • Accepted: Jun. 30, 2017 • Published Online: Jul. 19, 2017.

(Continued)

*Primary Examiner* — Shahed Ahmed
(74) *Attorney, Agent, or Firm* — Tarolli, Sundheim, Covell & Tummino LLP (57) ABSTRACT

A Josephson junction (JJ) device is disclosed that includes a first superconductor structure having a bottom superconductor arm portion and a second superconductor structure having a top superconductor arm portion disposed substantially orthogonal to the bottom superconductor arm portion and overlapping the bottom superconductor arm portion in a JJ operation region. The JJ device further includes a dielectric material layer acting as a tunnel barrier disposed between the bottom superconductor arm portion and the top superconductor arm portion in the JJ operation region to form an operating JJ.

10 Claims, 4 Drawing Sheets

(51) Int. Cl.
*H10N 60/12* (2023.01)
*H10N 60/85* (2023.01)

(58) Field of Classification Search
CPC ...... H10N 99/05; H01L 21/0273–0279; H01L 21/285–2885; H01L 21/32058; H01L 21/76891
See application file for complete search history.

(56) References Cited

OTHER PUBLICATIONS

Potts, et al.: "CMOS compatible fabrication methods for submicron Josephson junction qubits"; Nanotechnology and Quantum Computing; Article in IEE Proceedings—Science Measurement and Technology • Oct. 2001 DOI: 10.1049/ip-smt:20010395 • Source: IEEE Xplore.

Dolan: "Offset masks for lift-off photoprocessing"; Appl. Phys. Lett. 31, 337 (1977); https://doi.org/10.1063/1.89690, Published Online: Aug. 26, 2008.

Kreikebaum, et al.: "Improving wafer-scale Josephson junction resistance variation in superconducting quantum coherent circuits"; IOP Publishing, Superconductor Science and Technology, Supercond. Sci. Technol. 33 (2020) 06LT02 (6pp), https://doi.org/10.1088/1361-6668/ab8617.

Bal, et al.: "Overlap junctions for superconducting quantum electronics and amplifiers"; Appl. Phys. Lett. 118, 112601 (2021); https://doi.org/10.1063/5.0048621; Submitted: Feb. 24, 2021 • Accepted: Feb. 25, 2021 • Published Online: Mar. 15, 2021.

\* cited by examiner

JOSEPHSON JUNCTION DEVICE WITH ORTHOGONAL ELECTRODES

GOVERNMENT INTEREST

The invention was made under Government Contract. Therefore, the US Government has rights to the invention as specified in that contract.

TECHNICAL FIELD

The present invention relates generally to superconductors, and more particularly to a Josephson junction device with orthogonal electrodes.

BACKGROUND

Superconducting circuits are one of the leading technologies being developed for enhancement of communication signal integrity or increasing computing processing power. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Furthermore, the need for low-temperature processing currently presents one of the more significant barriers to mass production of superconducting devices.

One of the common devices employed in superconducting circuits is a Josephson junction (JJ). JJs have important applications in a variety of circuits, such as superconducting quantum interference devices (SQUIDs), superconducting quantum bits (qubits), and rapid single flux quantum (RSFQ) digital electronics. A JJ is a device that consists of two superconductors weakly coupled by a region which may be either non-superconducting or a weaker superconductor. For example, one type of JJ consists of two superconductors separated by a thin insulating barrier. The JJ has a critical current, which is the maximum supercurrent that the junction can sustain without dissipation. When a current through the JJ exceeds the critical current, the JJ switches from a zero-voltage to a finite-voltage state, a process which is leveraged for some circuit applications. Furthermore, the inductance of the JJ and the energy associated with the JJ both depend on the critical current ($I_C$), both of which can have an impact on circuit performance. Consequently, it is important to achieve and maintain a consistent critical current ($I_C$) with minimal process variation for the JJ for the application employing the JJ to operate properly. In addition to critical current spread due to process variation, it also well known that the critical current of JJs can drift over time. This effect is known as junction aging and can have a deleterious effect on the consistent operation of the JJ application. Thus, it is advantageous to have a fabrication process that can make a JJ robust against aging effects and ensure a stable critical current over time.

SUMMARY

In one example, a Josephson junction (JJ) device is provided. The JJ device comprises a first superconductor structure having a bottom superconductor arm portion and a second superconductor structure having a top arm superconductor arm portion disposed substantially orthogonal to the bottom superconductor arm portion and overlapping the bottom superconductor arm portion in a JJ operation region. The JJ device further comprises a dielectric material layer disposed between the bottom superconductor arm portion and the top superconductor arm portion in the JJ operation region to form an operating JJ.

In another example, a method of forming a JJ device is provided. The method comprises forming a photoresist material layer over a substrate to provide a JJ structure, patterning the photoresist material layer to form a first opening and a second opening in the photoresist material layer with the first opening having a first arm opening and the second opening have a second arm opening, such that the first arm opening is substantially orthogonal to the second arm opening and the first arm opening and the second arm opening are separated by a region of photoresist material layer. The method further comprises performing one of a perpendicular superconductor deposition process and an angular superconductor deposition process on the JJ structure to form a plurality of superconductor bottom superconductor electrodes on the substrate, performing a dielectric formation process to provide a dielectric top surface on the plurality of superconductor bottom superconductor electrodes, and performing the other of a perpendicular superconductor deposition process and an angular superconductor deposition process on the JJ structure to form a plurality of superconductor top superconductor electrodes overlapping a portion of the plurality of bottom superconductor electrodes to form a first superconductor structure with a first superconductor arm portion and a second superconductor structure with a second superconductor arm portion with the first superconductor arm portion overlapping a portion of the second superconductor arm portion with a dielectric layer sandwiched therebetween to form an operating Josephson junction (JJ). The photoresist material layer is then removed to provide a final resulting JJ structure.

DETAILED DESCRIPTION

The present disclosure is directed to a Josephson junction (JJ) device and a method of making the same. In one example, the JJ device includes a shadow-evaporated aluminum (Al) based superconducting JJ (e.g., Al/aluminum-oxide (AlOx)/Al). Shadow-evaporated Josephson junctions (JJ) are a cornerstone of superconducting quantum electronics. A particular design that has been used extensively is the Dolan bridge JJ. The traditional Dolan bridge utilizes a floating resist bridge and two subsequent angled depositions that create an Al/AlOx/Al device underneath the bridge. The nature of this process makes the Josephson junction susceptible to fabrication process variation due to a number of factors. In the Dolan bridge design, the junction area is sensitive to variations in photoresist thickness, photoresist bridge width, metal deposition angle, and other photolithography variations. Small variations in the electrode deposition angles create a non-uniformity, which varies the Ohmic resistance (Rn) across the chip and wafer. Reduced variation in Rn is desired because the critical current depends on Rn, $I_C \propto 1/Rn$. Variation in the photoresist layer thicknesses also results in non-uniformity in Rn as these are key variables in setting the area of the junction. Furthermore, the Dolan bridge design is effective in creating a shadow evaporated junction on a small scale but succumbs to inherent process variation when utilized on a larger scale.

In microchip fabrication, yield loss occurs during production and test. Chips outside the required Rn (or equivalently, $I_C$) matching specification will not be able to perform as desired and are considered to be a yield loss. Improving Rn distribution across the chip and substrate as well as better device targeting will result in more chips that pass the specified criteria and are deemed acceptable. Superconducting microchips are inherently expensive and time-consuming to fabricate, and any yield improvement due to improved parametric targeting and spread will result in time and cost savings.

The present disclosure provides a shadow-evaporated JJ and process that reduces the sources of variation in a traditional Dolan bridge junction process due primarily to bridge and angle variation—by making the overlapping electrodes orthogonal and by making one of the depositions perpendicular to the substrate instead of angled. This is done while preserving a high-quality, in situ tunnel barrier formation (e.g., oxidation), which is critical for achieving a uniform tunnel barrier. Furthermore, the present disclosure offers these advantages without requiring significantly different or new processing equipment or techniques. Thus, the process can be integrated into most typical process flows that utilize either DUV or e-beam photolithography systems and associated materials already in use that provide a path for production-level volume.

In one example, a methodology includes depositing bottom superconductor electrodes with the wafer aligned parallel to a bottom superconductor electrode lithography and at a sufficient angle (e.g., 45 degrees), such that the metal deposition is completely under a central region of photoresist material. The bottom superconductor electrodes are then oxidized to form a junction barrier. Top superconductor electrodes are deposited in a traditional manner with the substrate perpendicular to the deposition source with a portion of the top superconductor electrodes overlapping a portion of the bottom superconductor electrodes in a substantial orthogonal orientation. This deposition of the top superconductor electrodes completes the Josephson junction. Furthermore, a similar overlapped structure can be formed by reversing the order of which the wafer is tilted. For example, the bottom superconductor electrodes may be deposited first and perpendicular to the metal source. Then the wafer is oxidized to form the junction barrier. The wafer is then tilted and top superconductor electrodes are deposited at a tilt (e.g. 45 degrees relative to source) to complete the formation of the JJ.

Figure 1:
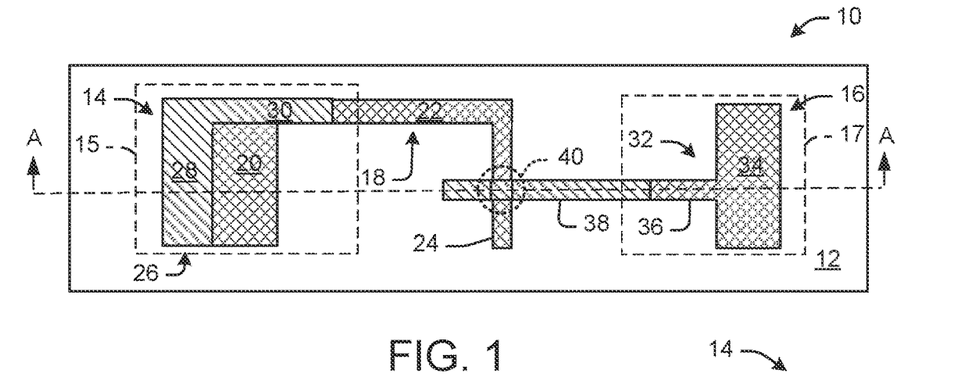
FIG. 1 illustrates plan view of an example JJ device.
Figure 2:
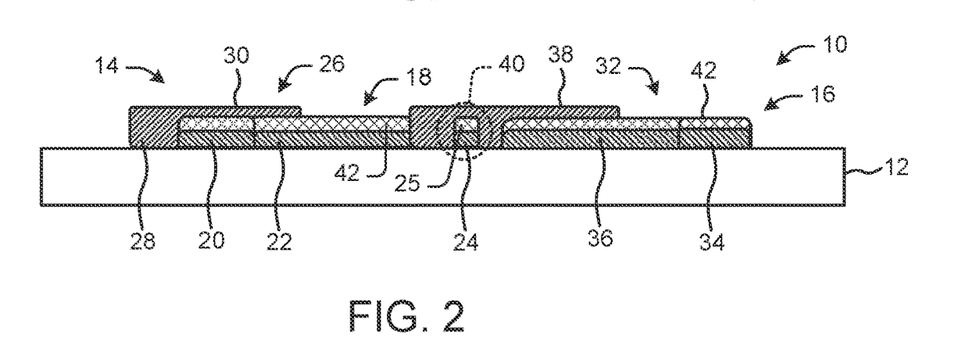
FIG. 2 illustrates a cross-sectional view of the JJ device of FIG. 1 along lines A-A.

FIG. 1 illustrates a plan view of an example JJ device 10. FIG. 2 illustrates a cross-sectional view of the JJ device of FIG. 1 along lines A-A. The JJ device 10 includes a first superconductor structure 14 having a generally U-shape and a second superconductor structure 16 with a generally T-shape both disposed on a substrate 12. Both the first superconductor structure 14 and the second superconductor structure 16 are formed from bottom superconductor electrodes formed by a first superconductor deposition process, dielectric layers formed from a dielectric formation process (e.g., dielectric deposition, oxidation) and top superconductor electrodes formed by a second superconductor deposition process. The first superconductor structure 14 includes a generally U-shaped bottom superconductor electrode 18 having a first bottom superconductor base portion 20 and a bottom superconductor arm portion 24 coupled by a bottom superconductor connector portion 22. A portion of the U-shaped bottom superconductor electrode 18 is covered by a L-shaped top superconductor electrode 26. The L-shaped top superconductor electrode 26 includes a first top superconductor base portion 28 that overlaps a portion of the first bottom superconductor base portion 20 and a top superconductor connector portion 30 that covers a portion of the bottom superconductor connector portion 22.

The second superconductor structure 16 includes a generally T-shaped bottom superconductor electrode 32 partially covered by a top arm superconductor electrode 38. The generally T-shaped bottom superconductor electrode 32 includes a second bottom superconductor base portion 34 connected to a second bottom superconductor arm portion 36. A top arm superconductor electrode 38 covers a portion of the second bottom superconductor arm portion 36. A dielectric material layer 42 covers the top surface of the generally U-shaped bottom superconductor electrode 18 and the generally T-shaped bottom superconductor electrode 34. The dielectric material layer 42 is also sandwiched in between the top superconductor electrode portions that cover the bottom superconductor electrode portions. Importantly, the top arm superconductor electrode 38 overlaps the first bottom superconductor arm portion 24 with a tunnel barrier region 25 (formed by the sandwiched dielectric material layer) disposed therebetween to form an operating JJ 40.

As show in FIG. 1, a portion of the first superconductor structure 14 has a first connecting end 15 for connecting a first end of the operating JJ 40 to ground or additional circuitry, and a portion of the second superconductor structure 16 has a second connecting end 17 for connecting a second end of the operating JJ 40 to ground or additionally circuitry. Although the first superconductor structure 14 is shown as generally U-shaped and the second superconductor structure 16 is shown as generally T-shaped, the first superconductor structure 14 and the second superconductor structure 16 can take on a variety of shapes and configurations based on a particular design and fabrication prcess. Furthermore, the generally L-shape of the first connecting end 15 and the generally T-shape of the second connecting end 17 can take on a variety of shapes and configurations. For example, the connecting ends can be generally orthogonal (approaching from sides) to the bottom superconductor connector portion 22 and/or the top arm superconductor electrode 38. Alternatively, the connecting ends can come from top or bottom layers to connect to the superconductor connector portion 22 and/or the top arm superconductor electrode 38. Furthermore, the connecting ends can be formed from ends of the superconductor connector portion 22 and/or the top arm superconductor electrode 38, or a combination of any of the previously stated connecting end configurations.

The elements of the JJ device 10 can be formed sequentially under vacuum on a wafer to form the JJ device 10. The wafer can then be subjected to an additional oxidation process, in the same process chamber that forms the elements of the JJ device 10, to form a robust, high-quality native oxide on the surface of the JJ device 10. When the wafer is removed from the vacuum chamber, the surface is immediately exposed to water vapor and organic contaminants in atmosphere. This robust native oxide passivates the surface and prevents diffusion of contaminants to the tunnel barrier region of the operating JJ 40, hereby stabilizing the $I_C$ of the operating JJ 40 against aging effects.

Turning now to FIGS. 3-11, fabrication is discussed in connection with formation of a JJ structure that includes an operating JJ of FIG. 1. As previously stated, the process flow that shows the formation of the operating JJ shown in FIGS. 3-11 illustrates the utilization of a perpendicular superconductor deposition process to form bottom superconductor electrodes followed by an angular deposition process to form top superconductor electrodes. Alternatively, the bottom superconductor electrodes can be formed by an angular superconductor process and the top superconductor electrodes can be formed by a perpendicular superconductor deposition process.

Figure 3:
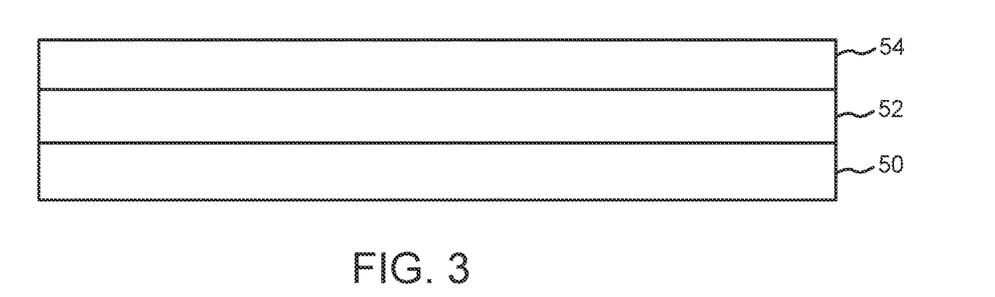
FIG. 3 illustrates a cross-sectional view of a JJ structure in its early stages of fabrication.
Figure 4:
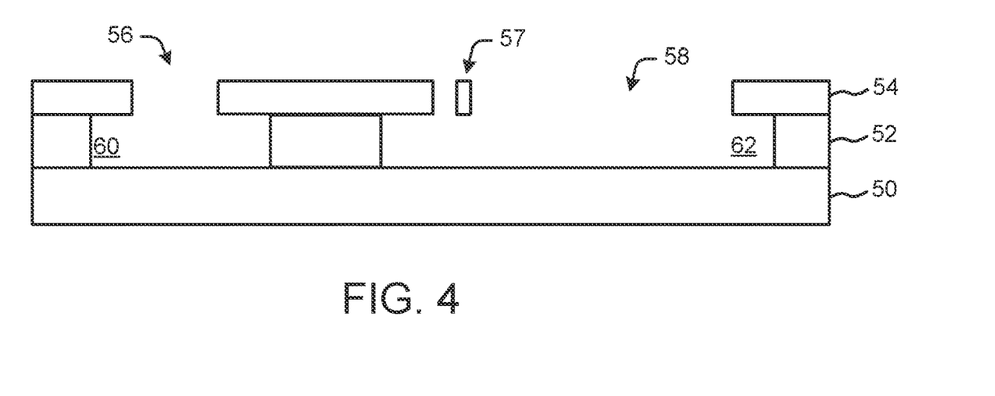
FIG. 4 illustrates a cross-sectional view of the JJ structure of FIG. 3 after a photoresist patterning process.
Figure 5:
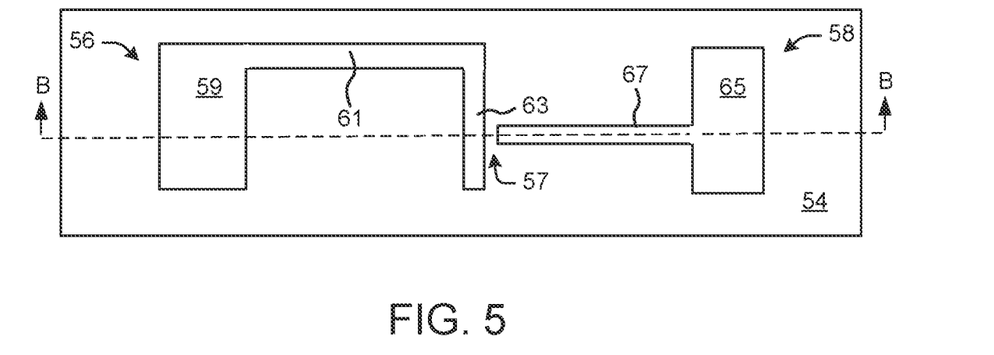
FIG. 5 illustrates a plan view of the structure of FIG. 4 showing cross-sectional lines for FIG. 4 along lines B-B.

FIG. 3 illustrates a cross-sectional view of a JJ structure in its early stages of fabrication. The JJ structure includes a first photoresist material layer 52 overlying a substrate 50, and a second photoresist material layer 54 overlying the first photoresist material layer 52. The substrate 50 can be, for example, a silicon or glass wafer that provides mechanical support for the formation. The first photoresist material layer 52 is a lift-off resist material, and the second photoresist material layer 54 is a standard photoresist material layer. The first photoresist material layer 52 and the second photoresist material layer 54 are then patterned and developed to expose a generally U-shaped opening 56 and a generally T-shaped opening 58 in the first photoresist material layer 52 and the second photoresist material layer 54 in accordance with a trench pattern. A central region 57 of the second photoresist material layer provides a separation between the generally U-shaped opening 56 and the generally T-shaped opening 58. The first photoresist material layer 52 is configured to be undercut by the photoresist material developer employed during the patterning and developing process to provide the resultant undercut regions 60 and 62. The resultant structure is shown in the cross-sectional view of FIG. 4. FIG. 5 illustrates a plan view of the structure of FIG. 4.

The first photoresist material layer 52 and the second photoresist material layer 54 can have a thickness that varies in correspondence with the wavelength of radiation used to pattern the first photoresist material layer 52 and the second photoresist material layer 54. The first photoresist material layer 52 may be formed over the substrate 50 and the second photoresist material layer 54 may be formed over the first photoresist material layer 52 via spin-coating techniques, selectively irradiated (e.g., via deep ultraviolet (DUV) irradiation), and developed to form the trench openings 56 and 58, the central region 57 and undercut regions 62 and 64.

As shown in FIG. 4 and FIG. 5, the generally U-shaped opening includes a first base opening 59 and a first connecting opening 61 having a first end that extends from an end of the first base opening 59 generally orthogonal to the first base opening 59. A second end of the first connecting opening 61 extends to a first end of a first arm opening 63. The first arm opening 63 extends generally orthogonal to the first connecting opening 61. The generally T-shaped opening 58 includes a second base opening 65 having a first end of a second arm opening 67 extending from a central area of the second base opening 65 generally orthogonal to the second base opening 65. A second end of the second arm opening 67 extends toward the first arm opening 63 separated by the central region 57 of the second photoresist material layer 54. The first arm opening 63 extends substantially orthogonal to the second arm opening 67.

Figure 6:
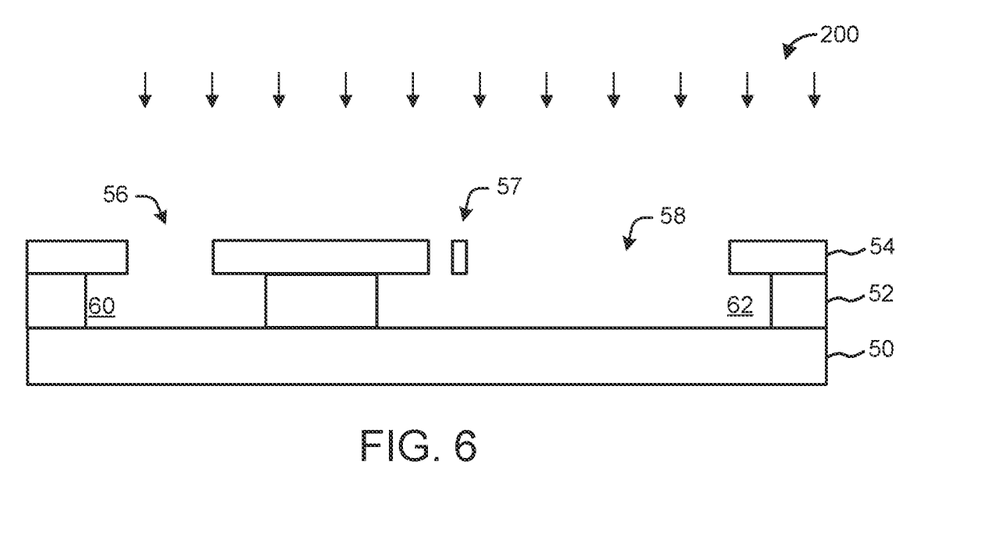
FIG. 6 illustrates a cross-sectional view of the JJ structure of FIGS. 4-5 undergoing a perpendicular superconductor deposition process.
Figure 7:
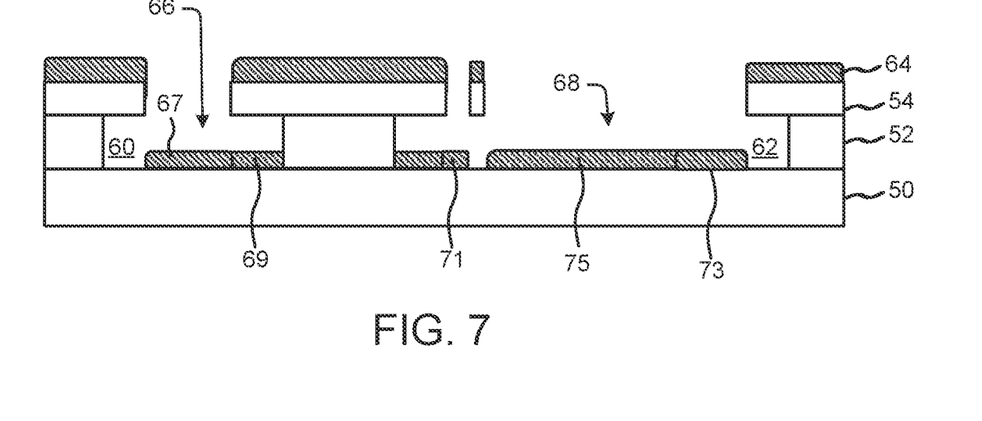
FIG. 7 illustrates a cross-sectional view of the JJ structure of FIG. 6 after undergoing the perpendicular superconductor deposition process.

The JJ structure can then be placed in a deposition process chamber under vacuum. Next as illustrated in FIG. 6, a first (perpendicular) superconductor deposition process 200 is performed on the structure of FIG. 5. A set of bottom superconductor electrodes are deposited in a traditional manner with the substrate 50 perpendicular to the deposition source. The deposition process 200 can be performed by a variety of different deposition processes such as sputter deposition of, for example, aluminum to form a generally U-shaped bottom superconductor electrode 66 and a generally T-shaped bottom superconductor electrode 68. The generally U-shaped bottom superconductor electrode includes a first bottom superconductor base portion 67 and a bottom superconductor arm portion 71 coupled by a bottom superconductor connector portion 69. The generally T-shaped bottom superconductor electrode 68 includes a second bottom superconductor base portion 73 connected to a second bottom superconductor arm portion (electrode) 75. The deposition process 200 can be a superconductor metal evaporation process such as evaporation of aluminum to form the generally U-shaped bottom superconductor electrode 66 and the generally T-shaped bottom superconductor electrode 68. The resultant structure is shown in FIG. 7.

Figure 8:
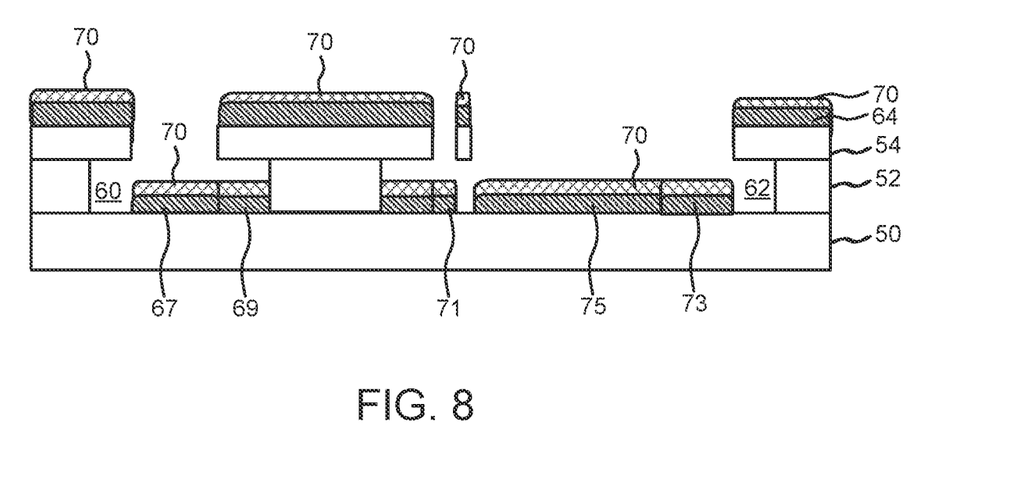
FIG. 8 illustrates a cross-sectional view of the JJ structure of FIG. 7 after undergoing a dielectric formation process.

Next, the top surfaces of the generally U-shaped bottom superconductor electrode 66 and a generally T-shaped bottom superconductor electrode 68 are oxidized to form an oxidized top surface 70 over the generally U-shaped bottom superconductor electrode 66 and a generally T-shaped bottom superconductor electrode 68, as illustrated in FIG. 8. For this process, the JJ structure can be placed in an oxidation chamber where it undergoes an oxidation process to form the oxidized top surface 70 over the generally U-shaped bottom superconductor electrode 66 and the generally T-shaped bottom superconductor electrode 68. The oxidation chamber can be the same or different chamber as the deposition chamber as long as the JJ structure remains under vacuum in a clean environment. The oxidized top surface 70 of the superconductor metal that overlies the second photoresist material layer 54 is also oxidized during the oxidation process. In one example, the oxidized top surface 70 is aluminum oxide formed by oxidizing the top surface of generally U-shaped bottom superconductor electrode 66 and a generally T-shaped bottom superconductor electrode 68, which is formed from aluminum. Alternate dielectric formation processes can be performed to form dielectric on the bottom superconductor electrodes.

Figure 9:
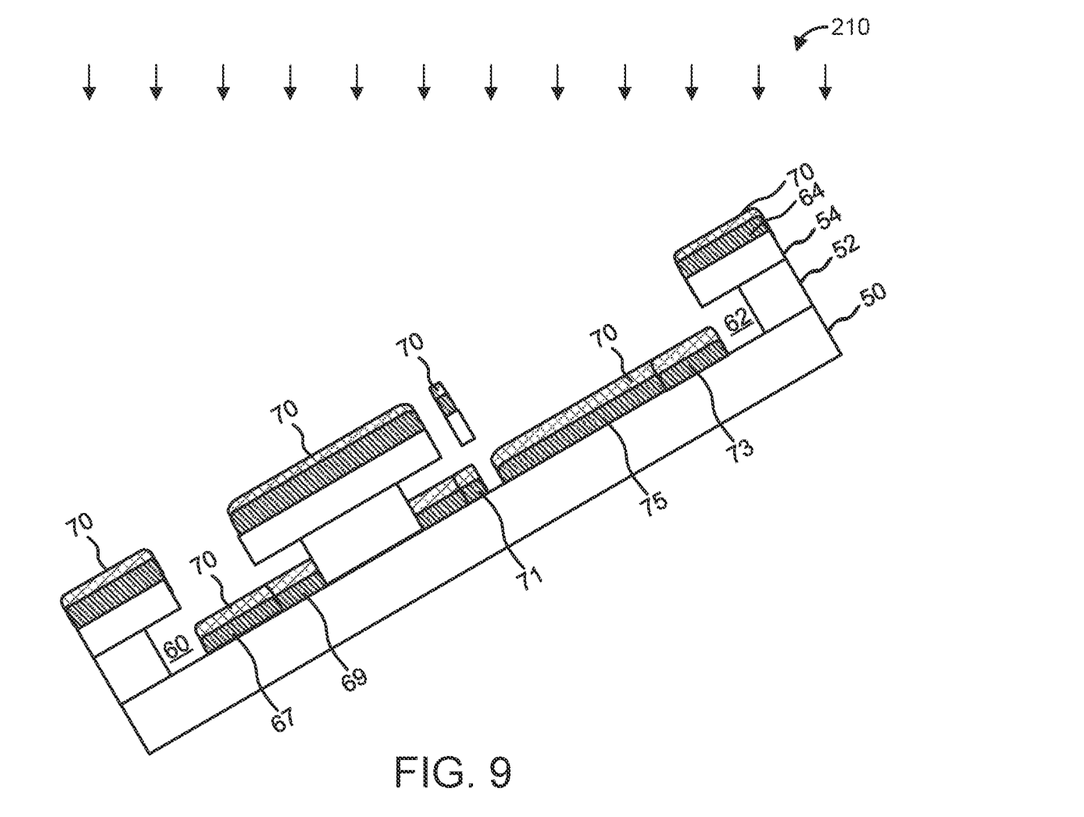
FIG. 9 illustrates a cross-sectional view of the JJ structure of FIG. 8 undergoing an angular superconductor deposition process.
Figure 10:
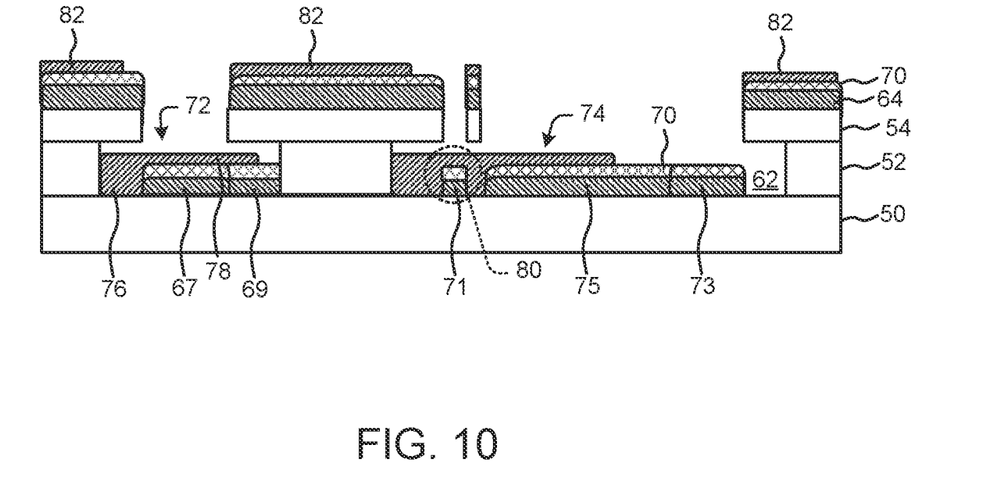
FIG. 10 illustrates a cross-sectional view of the JJ structure of FIG. 9 after undergoing the angular superconductor deposition process.

Next as illustrated in FIG. 9, an angular superconductor deposition process 210 is performed on the structure of FIG. 8. The angle of the angular superconductor deposition process can be achieved by rotating the JJ structure at an angle of rotation of about 30° to about 60° counterclockwise relative to the superconductor deposition source. That is, the angle of the incoming superconductor metal comes in at an angle of about 30° to about 60° relative to the top surface of the JJ structure. The deposition process can be performed by a variety of different deposition processes such as sputter deposition or evaporation of, for example, aluminum. The angular deposition process results in the formation of a top L-shaped top superconductor electrode 72 that covers a portion of the bottom U-shaped electrode 66 and a top superconductor arm portion 74 that covers a portion of the first bottom superconductor arm portion 71 and overlaps orthogonally over the first bottom superconductor arm portion encompassing a dielectric layer 70 therebetween, as illustrated in FIG. 10. Excess superconductor material 82 covers the dielectric layer 70 overlying the photoresist material layer 54. The top L-shaped top superconductor electrode 72 includes a top superconductor base portion 76 that covers a portion of the first bottom superconductor base portion 67 and a top superconductor connector portion 78 that covers a portion of the bottom superconductor connector portion 69 with a dielectric layer 70 disposed therebetween.

As illustrated in FIG. 10, an operating JJ 80 is formed between overlapping portions of the top superconductor arm portion (electrode) 74 and the first bottom superconductor arm portion 71 with a dielectric barrier 84 being disposed in between the overlapping areas of the top superconductor arm portion 74 and the first bottom superconductor arm portion 71. In the aluminum/aluminum oxide/aluminum example, a thin layer of aluminum oxide (oxidized portion 84) forms the tunnel barrier and the aluminum layers (the top superconductor arm portion 74 and the first bottom superconductor arm portion 71 on both sides) form the electrodes and set the gap voltage of the operating JJ 80. The thickness of the tunnel barrier determines Rn and thus $I_C$, with $I_C$ also depending on the gap voltage.

After the second superconductor deposition process shown in FIG. 9, the resultant JJ structure shown in FIG. 10 is placed in an oxidation chamber prior to exposure to atmosphere. Again, the oxidation chamber can be the same or different as the deposition chamber and the oxidation chamber as previously mentioned, as long as the JJ structure remains under vacuum in a clean environment. The JJ structure is then oxidized in the same manner that the dielectric layer is formed, but with a much higher exposure of about 450 torr to about 850 torr (e.g., about 650 torr) for about 1 hour to about 3 hours (e.g., about 2 hours). This process (see FIG. 11) forms a robust, high-quality protective dielectric layer 86 on the surface of the top base superconductor portion 76 and the top superconductor arm portion 74 over the operating JJ 80, which inhibits the diffusion of oxygen or other impurities to the dielectric barrier 84 of the operating JJ 80.

For the aluminum/aluminum oxide/aluminum example, the bottom aluminum electrodes, oxide layer, and top aluminum electrodes are all formed sequentially under vacuum. The JJ structure is then subjected to an additional oxidation step in the same process chamber which forms a robust, high-quality native oxide on any exposed Al surface. When the JJ structure is removed from the vacuum chamber the surface is immediately exposed to water vapor and organic contaminants in atmosphere. The robust native oxide passivates the Al surfaces and prevents diffusion of contaminants to the tunnel barrier region, hereby stabilizing the $I_C$ of the operating JJ.

Figure 11:
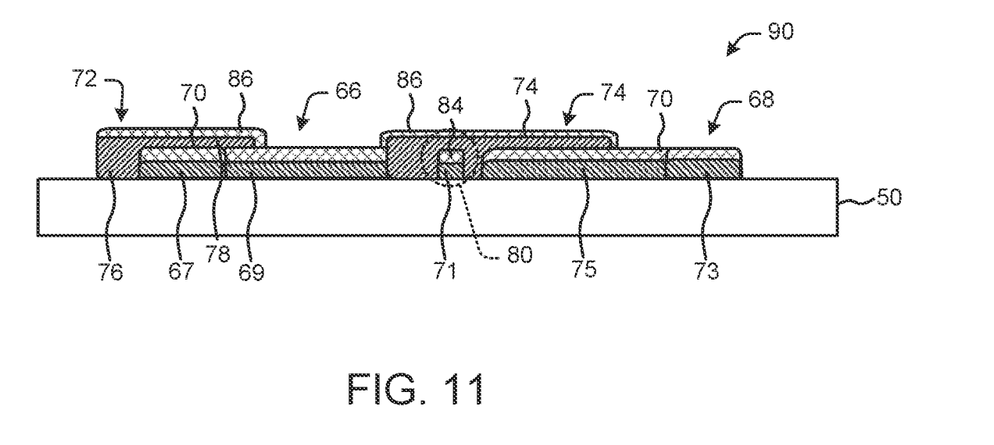
FIG. 11 illustrates a cross-sectional view of the JJ structure of FIG. 10 after undergoing an additional dielectric formation process and removal of the first and the second photoresist material layer.

Next, the first photoresist material layer 52 and the second photoresist material layer 54 are removed from the JJ structure to provide a resultant final JJ structure 90 of FIG. 11. The first photoresist material layer 52 and second photoresist material layer 54 can be removed via a lift-off process. Alternatively, the first photoresist material layer 52 and/or the second photoresist material layer 54 can be removed via a stripping process, for example, ashing in an $O_2$ plasma. The resultant structure 90 illustrated in FIG. 11 forms an operational JJ device.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A Josephson junction (JJ) device comprising:
 a first superconductor structure having a bottom superconductor electrode with a bottom superconductor arm portion and a top superconductor electrode covering a portion of the bottom superconductor electrode;
 a second superconductor structure having a bottom superconductor electrode with a bottom superconductor base portion and a top superconductor arm portion disposed substantially orthogonal to the bottom superconductor arm portion of the first superconductor structure and overlapping the bottom superconductor arm portion in a JJ operation region; and
 a dielectric material layer disposed between the bottom superconductor arm portion and the top superconductor arm portion in the JJ operation region to form an operating JJ, wherein the dielectric material layer extends over the bottom superconductor electrode of the first superconductor structure and the bottom superconductor electrode of the second superconductor structure.

2. The device of claim 1, wherein the operating JJ is an aluminum/aluminum oxide/aluminum JJ.

3. The device of claim 1, wherein portions of the operating JJ device are covered by a post-junction oxide layer to mitigate instabiliy of the Ic drift over time of the operating JJ.

4. The device of claim 1, wherein the first superconductor structure has a first connecting end for connecting a first end of the operating JJ to ground or additional circuitry and the second superconductor structure has a second connecting end for connecting a second end of the operating JJ to ground or additional circuitry.

5. The device of claim 4, wherein the first connecting end is one of generally orthogonal to the bottom superconductor arm portion, resides in one of a top or bottom layer relative to the layer of the bottom superconductor arm portion or is at an end of the bottom supercoductor arm portion and the second connecting end is one of generally orthogonal to the top superconductor arm portion, resides in one of a top or bottom layer relative to the layer of the top superconductor arm portion or is at an end of the top supercoductor arm portion.

6. The device of claim 1, wherein one of the first superconductor structure and the second superconductor structure has a generally U-shape and the other of the first superconductor structure and the second superconductor structure has a generally T-shape.

7. The device of claim 6, wherein the generally U-shaped superconductor structure has a generally U-shaped bottom superconductor electrode and a first top superconductor electrode that covers a portion of the generally U-shaped bottom superconductor electrode with the dielectric material layer overlying the generally U-shaped bottom superconductor electrode, and the generally T-shaped superconductor structure has a generally T-shaped bottom superconductor electrode and a top arm electrode that covers a portion of the generally T-shaped bottom superconductor electrode with the dielectric material layer overlying the generally T-shaped bottom superconductor electrode, the top arm electrode forming the top superconductor arm portion that overlaps the bottom superconductor arm portion.

8. The device of claim 1, wherein the first superconductor structure and the second superconductor structure both have top and bottom superconductor electrodes with the dielectric material layer disposed over the bottom superconductor electrodes.

9. The device of claim 1, wherein the top and bottom superconductor electrodes are formed from aluminum and the dielectric material layer is formed from aluminum oxide.

10. The device of claim 1, wherein portions of the operating JJ structure are covered by a post-junction dielectric layer to mitigate instabiliy of the Ic drift over time of the operating JJ.

* * * * *